(12) United States Patent
Akao

(10) Patent No.: US 7,897,466 B2
(45) Date of Patent: Mar. 1, 2011

(54) METHOD FOR MANUFACTURING SEMICONDUCTOR DEVICE

(75) Inventor: Yuji Akao, Sakata (JP)

(73) Assignee: Seiko Epson Corporation (JP)

( * ) Notice: Subject to any disclaimer, the term of this patent is extended or adjusted under 35 U.S.C. 154(b) by 154 days.

(21) Appl. No.: 12/142,011

(22) Filed: Jun. 19, 2008

(65) Prior Publication Data

US 2008/0318393 A1    Dec. 25, 2008

(30) Foreign Application Priority Data

Jun. 20, 2007    (JP) ................. 2007-162448

(51) Int. Cl.
   *H01L 21/00*    (2006.01)
(52) U.S. Cl. .................... 438/275; 257/E21.428
(58) Field of Classification Search .......... 438/275–277, 438/926; 257/E21.428
   See application file for complete search history.

(56) References Cited

U.S. PATENT DOCUMENTS

| 7,118,963 | B2 * | 10/2006 | Mori | 438/257 |
| 7,504,308 | B2 * | 3/2009 | Kim | 438/275 |
| 2004/0088658 | A1 | 5/2004 | Minda | |

FOREIGN PATENT DOCUMENTS

| JP | 06-310713 | 11/1994 |
| JP | 2003-031677 | 1/2003 |
| JP | 2004-152929 | 5/2004 |
| JP | 2004-266067 | 9/2004 |
| JP | 2004-342922 | 12/2004 |

* cited by examiner

*Primary Examiner* — Richard A. Booth
(74) *Attorney, Agent, or Firm* — Harness, Dickey & Pierce, P.L.C.

(57) ABSTRACT

There is provided a method for manufacturing a semiconductor device having a high breakdown voltage transistor and a low breakdown voltage transistor provided on a same semiconductor substrate. The method includes forming a first gate electrode of the high breakdown voltage transistor and a second gate electrode of the low breakdown voltage transistor on a transistor formation area of the substrate, as well as a dummy gate electrode on a dummy pattern formation area of the substrate; forming an interlayer insulation film on the substrate so as to cover the first and the second gate electrodes and the dummy gate electrode; and forming a first contact hole on the first gate electrode, a second contact hole on the second gate electrode, and a dummy contact hole on the dummy gate electrode, respectively, by partially dry etching the interlayer insulation film, wherein in the formation of the contact holes, a top surface of the dummy gate electrode is exposed at a bottom of the dummy contact hole before a top surface of the first gate electrode is exposed at a bottom of the first contact hole.

6 Claims, 7 Drawing Sheets

TRANSISTOR FORMATION AREA     SCRIBE AREA

METHOD FOR MANUFACTURING SEMICONDUCTOR DEVICE

The entire disclosure of Japanese Patent Application No. 2007-162448, filed Jun. 20, 2007 is expressly incorporated by reference herein.

BACKGROUND

1. Technical Field

The present invention relates to a method for manufacturing a semiconductor device, and in particular relates to a method for manufacturing a semiconductor device having a high breakdown voltage transistor and a low breakdown voltage transistor both provided on a same semiconductor substrate.

2. Related Art

FIG. 8A is a sectional view showing an example of a method for manufacturing a semiconductor device having a high breakdown voltage transistor (hereinafter referred to as an "HV transistor") 110 and a low breakdown voltage transistor (hereinafter referred to as an "LV transistor") 120 provided on a same silicon substrate 101. On the silicon substrate 101 are formed a thick field oxide film 111 and a thin field oxide film 121.

Next, a gate electrode 113 of the HV transistor 110 is formed so as to be extended from a top surface of a gate oxide film 112 onto a top surface of the thick field oxide film 111, and a gate electrode 123 of the LV transistor 120 is formed from a top surface of a gate oxide film 122 onto a surface of the thin field oxide film 121. Then, after forming a source/drain region and the like of each of the HV transistor 110 and the LV transistor 120, an interlayer insulation film 130 is formed on an entire surface of the silicon substrate 101 to cover both transistors.

Next, using photolithography and dry etching, the interlayer insulation film 130 is partially dry-etched to form a contact hole 131 on the gate electrode 113 extended onto the field oxide film 111 and to form a contact hole 133 on the gate electrode 123 extended onto the field oxide film 121. Additionally, a contact hole 132 is formed to directly contact with the silicon substrate 101. Thereafter, for example, a metal layer made of aluminum or the like is embedded into each of the contact holes 131 to 133 to form a contact electrode (not shown).

In the semiconductor device shown in FIG. 8A, a top surface of the gate electrode 113 extended onto the field oxide film 111 is in a position higher than a top surface of the gate electrode 123 extended onto the field oxide film 121 when sectionally viewed. Thus, when forming the contact holes, the contact hole 131 is opened (completed) faster than the contact hole 133. During a time until the contact hole 133 is opened, the surface of the gate electrode 113 is exposed to an etching atmosphere at a bottom of the contact hole 131. For example, when forming the contact holes by plasma etching, the surface of the gate electrode 113 is exposed to a plasma atmosphere, so that plasma charge is applied to the gate oxide film 112 via the gate electrode 113. Consequently, the plasma charge can cause damage to the gate insulation film (the gate oxide film 112), which can lead to destruction of the gate insulation film.

In order to prevent the insulation destruction, JP-A-1994-310713 discloses a method as shown in FIG. 8B, for example. In the drawing, a fuse 114 is formed so as to be continued to the gate electrode 113 of the HV transistor such that the gate electrode 113 is electrically in contact with another active area other than the gate oxide film 112. The gate electrode 113 and the fuse 114 are simultaneously formed, for example, by the deposition and patterning of a polysilicon film. Thereafter, the interlayer insulation film 130 is formed, which is followed by the formation of the contact holes 131 to 133. In the method, plasma charge is applied to the silicon substrate 101 from the gate electrode 113 via the fuse 114, so that there is no damage to the gate oxide film 112 due to the plasma charge.

In the above method disclosed, however, after the formation of the contact holes 131 to 133, cutting of the fuse 114 is needed, for example, at positions indicated by broken lines shown in FIG. 8B to disconnect the gate electrode 113 from the active area. This increases the number of processing steps for photolithography and dry etching. Additionally, when cutting the fuse 114, the plasma charge may be applied to the gate oxide film 112 via the gate electrode 113, thereby causing damage to the gate oxide film 112.

SUMMARY

An advantage of the invention is to provide a method for manufacturing a semiconductor device that can reduce damage to a gate insulation film of a high breakdown voltage transistor when dry etching is performed on an interlayer insulation film to form contact holes.

The inventor of the invention investigated and found that the smaller the ratio of gate electrodes of a high breakdown voltage transistor to a total number of gate electrodes formed on a semiconductor substrate, the higher the plasma charge concentration on the gate electrodes of the high breakdown voltage transistor and thus the greater the damage to a gate insulation film of the transistor. Particularly, regarding gate electrodes formed on a wafer, when the ratio of the gate electrodes of a high breakdown voltage transistor to those of a low breakdown voltage transistor is 1% or less to 99% or more, plasma charge tends to concentrate on the gate electrodes of the high breakdown voltage transistor. This increases a risk of destruction of the gate insulation film caused by the plasma charge. Thus, the invention has been implemented based on the findings.

In order to solve the problem described above, according to a first aspect of the invention, there is provided a method for manufacturing a semiconductor device having a high breakdown voltage transistor and a low breakdown voltage transistor provided on a same semiconductor substrate. The method includes forming a first gate electrode of the high breakdown voltage transistor and a second gate electrode of the low breakdown voltage transistor on a transistor formation area of the substrate, as well as a dummy gate electrode on a dummy pattern formation area of the substrate; forming an interlayer insulation film on the substrate so as to cover the first and the second gate electrodes and the dummy gate electrode; and forming a first contact hole on the first gate electrode, a second contact hole on the second gate electrode, and a dummy contact hole on the dummy gate electrode, respectively, by partially dry etching the interlayer insulation film, wherein in the formation of the contact holes, a top surface of the dummy gate electrode is exposed at a bottom of the dummy contact hole before a top surface of the first gate electrode is exposed at a bottom of the first contact hole.

In the semiconductor device described above, the "high breakdown voltage transistor" and the "low breakdown voltage transistor" are a high breakdown voltage metal-oxide-semiconductor (MOS) transistor and a low breakdown voltage MOS transistor. The gate insulation film of each of the MOS transistors may be made of any one or combination of films arbitrarily selected from a silicon oxide film, a silicon oxynitride (SiON) film, a high-permittivity (high-k) film, and the like, for example.

Preferably, the method according to the first aspect further includes forming a first element-isolation film on the transistor formation area of the semiconductor substrate; forming a second element-isolation film on the transistor formation area of the substrate in such a manner that a height from a top surface of the substrate to a top surface of the second element-isolation film is lower than a height from the substrate top surface to a top surface of the first element-isolation film; and forming a dummy element-isolation film on the dummy pattern formation area of the substrate in such a manner that a height from the substrate top surface to a top surface of the dummy element-isolation film is equal to or higher than the height from the substrate top surface to the top surface of the first element-isolation film, wherein in the formation of the gate electrodes, the first gate electrode, the second gate electrode, and the dummy gate electrode, respectively, are extended onto the first element-isolation film, the second element-isolation film, and the dummy element-isolation film, respectively, and wherein in the formation of the contact holes, portions of the interlayer insulation film positioned immediately above the first element-isolation film and immediately above the dummy element-isolation film are etched in a same processing step to form the first contact hole and the dummy contact hole, respectively.

In the method described above, when the first and the second contact holes are formed, the surface of the dummy gate electrode is exposed to a plasma atmosphere nearly simultaneously when or before the surface of the first gate electrode is exposed to the plasma atmosphere. Thus, plasma charge applied to the first gate electrode can be dispersed to the dummy gate electrode, thereby preventing concentration of the plasma charge on the first gate electrode. This can reduce damage to the gate insulation film of the high breakdown voltage transistor, whereby, for example, destruction of the gate insulation film can be prevented.

Additionally, unlike the known art disclosed in JP-A-1994-310713, formation and cutting of a fuse is not needed. This can prevent a problem such as plasma charge-induced damage to the gate insulation film during fuse cutting.

Furthermore, in the method above, for example, when the height of the dummy element-isolation layer from the substrate top surface is higher than the height of the first element-isolation layer from the substrate top surface, the top surface of the dummy gate electrode can be exposed with high reproducibility from the bottom of the dummy contact hole before the top surface of the first gate electrode is exposed at the bottom of the first contact hole. This can more surely prevent the plasma charge concentration on the first gate electrode.

Preferably, the method above further includes forming a recessed portion immediately above the dummy electrode extended onto the dummy element-isolation film by partially dry etching the interlayer insulation film before forming the first and the second contact holes and the dummy contact hole, without forming any recessed portion immediately above the first gate electrode extended onto the first element-isolation film.

Preferably, the method above further includes forming an insulation film on the dummy element-isolation film, without forming any insulation film on the first element-isolation film, wherein in the formation of the gate electrodes, the dummy gate electrode is extended onto the insulation film formed on the dummy element-isolation film.

In the method above, the description that "without forming any insulation film on the first element-isolation layer" includes a meaning that any insulation film is originally not formed on the first element-isolation layer and a meaning that after an insulation film is once formed on the first element-isolation layer, the insulation film is removed from the first element-isolation layer before the formation of the first gate electrode.

Preferably, in the method above, when diameters of the first and the dummy contact holes are represented by $\phi 1$ and $\phi 2$, respectively, the first and the dummy contact holes are formed in such a manner that the diameter $\phi 1$ is smaller than the diameter $\phi 2$. In this case, in a comparison between the contact hole having the larger diameter and the contact hole having the smaller diameter, the former one can be etched more easily and thus can be opened faster than the latter one.

In the above method, before the top surface of the first gate electrode is exposed at the bottom of the first contact hole, the top surface of the dummy gate electrode can be exposed at the bottom of the dummy contact hole. This can more surely prevent the plasma charge concentration on the first gate electrode.

Preferably, in the method according to the first aspect, the dummy pattern formation area is provided on a guard ring formation area positioned at a periphery of a chip formation area. In this case, the "guard ring" is a metal layer that surrounds a chip in a planar view to prevent entry of humidity or the like into the chip from the outside thereof.

Preferably, in the method according to the first aspect, the dummy pattern formation area is provided on a non-chip formation area. In this case, the "non-chip formation area" includes, for example, a scribe area (a scribe line) positioned between chips, an invalid chip area that is positioned at a periphery of a wafer and where no chip can be formed as a product, and a numbering area that is near an orientation flat and where a lot number or the like is directly printed. In those areas, chips as products cannot be formed.

In the method above, an area exclusive for the dummy pattern formation area is not needed, because another area doubles as the dummy pattern formation area. This can prevent an increase in a chip area.

According to a second aspect of the invention, there is provided a method for manufacturing a semiconductor device having a first transistor with a first gate electrode and a second transistor with a second gate electrode provided on a same semiconductor substrate in such a manner that a height from a top surface of the substrate to a top surface of the second gate electrode is lower than a height from the substrate top surface to a top surface of the first gate electrode. The method includes forming the first gate electrode of the first transistor and the second gate electrode of the second transistor on a transistor formation area of the substrate, as well as a dummy gate electrode on a dummy pattern formation area of the substrate; forming an interlayer insulation film on the substrate so as to cover the first and the second gate electrodes and the dummy gate electrode; and forming a first contact hole on the first gate electrode, a second contact hole on the second gate electrode, and a dummy contact hole on the dummy gate electrode, respectively, by partially etching the interlayer insulation film, wherein in the formation of the contact holes, a top surface of the dummy gate electrode is exposed at a bottom of the dummy contact hole before a top surface of the first gate electrode is exposed at a bottom of the first contact hole.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanied drawings.

First Embodiment

Figure 1A:
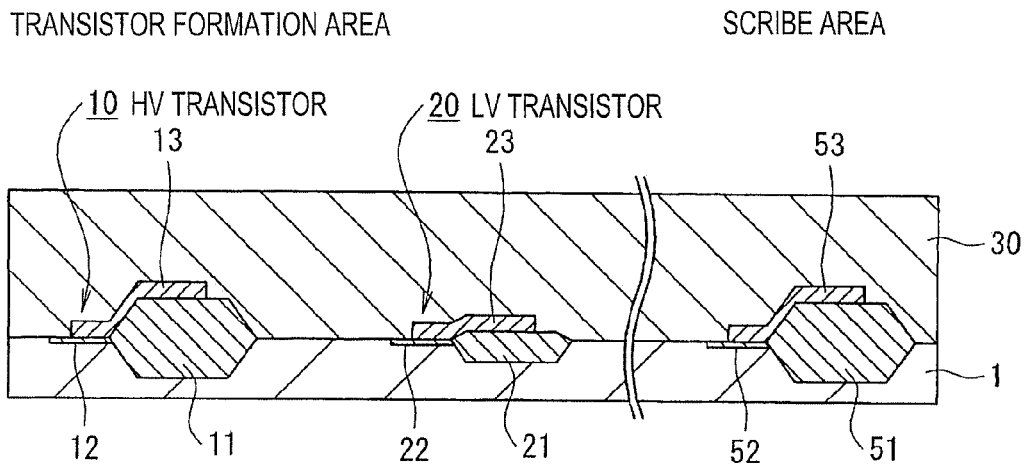
FIGS. 1A to 1C are sectional views showing a method for manufacturing a semiconductor device according to a first embodiment of the invention.
Figure 1B:
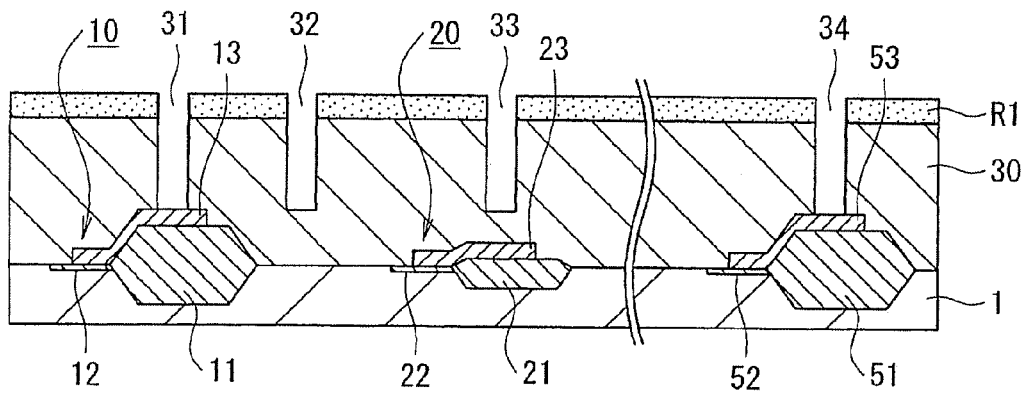
Figure 1C:
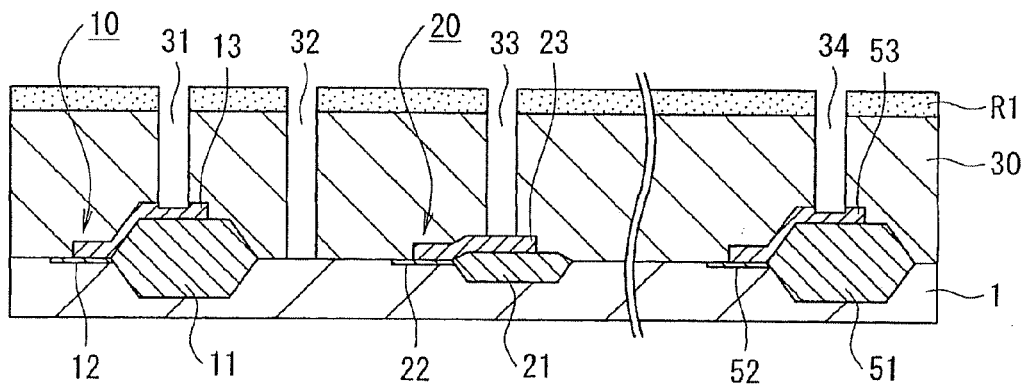

FIGS. 1A to 1C are sectional views showing a method for manufacturing a semiconductor device according to a first embodiment of the invention. The embodiment will describe the manufacturing method of the semiconductor device that has a high breakdown voltage transistor (an HV transistor) 10 and a low breakdown voltage transistor (an LV transistor) 20 both provided on a same silicon substrate 1.

In FIG. 1A, a transistor formation area is an area where the HV transistor 10, the LV transistor 20, and the like are formed; a scribe area, which is equivalent to a scribe line, is a cutting allowance area to be cut by a diamond cutter in a dicing process. In FIG. 1A, first, on the silicon substrate 1 are formed field oxide films 11, 21, and 51 to isolate individual elements from one another by a local oxidation of silicon (LOCOS) method or the like. In this case, for example, on the transistor formation area and the scribe area, respectively, of the silicon substrate 1 are formed the field oxide films 11 and 51, respectively, each of which has a large thickness, namely, a large height from a top surface of the silicon substrate 1. Following the formation of the thick field oxide films 11 and 51, on the transistor formation area of the silicon substrate 1 is formed the field oxide film 21 having a small thickness, namely, a small height from the top surface of the silicon substrate 1. The thickness of the field oxide film 11 is equal to that of the field oxide film 51, as well as the top surface of the field oxide film 11 is positioned at the same height as that of the field oxide film 51 when sectionally viewed.

Next, for example, the silicon substrate 1 having the field oxide films 11, 21, and 51 formed thereon is thermally oxidized to form a gate oxide film 12 of the HV transistor 10 and a gate oxide film 22 of the LV transistor 20 on the transistor formation area of the surface of the silicon substrate 1, as well as to form a dummy gate oxide film 52 on the scribe area of the silicon substrate surface. Then, for example, using a chemical vapor deposition (CVD) method, a polysilicon film is deposited entirely on the surface of the silicon substrate 1 having the gate oxide films 12, 22 and the dummy gate oxide film 52 formed thereon. During or after the deposition of the polysilicon film, an impurity such as phosphorus or boron is introduced into the polysilicon film to provide conductivity to the film.

Next, using photolithography and dry etching, pattering of the polysilicon film is performed to form a gate electrode 13 of the HV transistor 10 and a gate electrode 23 of the LV transistor 20 on the transistor formation area of the silicon substrate 1, as well as to form a dummy gate electrode 53 on the scribe area of the silicon substrate 1. As shown in FIG. 1A, in this case, the gate electrodes 13 and 23, respectively, are formed so as to be extended onto the field oxide film 11 and 21, respectively. Additionally, the dummy gate electrode 53 is formed so as to be extended onto the field oxide film 51.

Next, for example, using the CVD method, an interlayer insulation film 30 is formed on the entire surface of the silicon substrate 1 having the gate electrodes 13, 23 and the dummy gate electrode 53 formed thereon. Thereafter, for example, a chemical mechanical polish (CMP) process is performed to planarize a surface of the interlayer insulation film 30. Then, each opening is formed at a portion immediately above the gate electrode 13 extended onto the field oxide film 11, at a portion immediately above the transistor formation area of the silicon substrate 1, at a portion immediately above the gate electrode 23 extended onto the field oxide film 21, and at a portion immediately above the dummy gate electrode 53 extended onto the field oxide film 51, whereas a resist pattern R1 is formed on the interlayer insulation film 30 to cover remaining portions. In that case, opening portions of the resist pattern R1 have, for example, a round shape in a planar view (namely, a round planar shape) and also have an equal diameter.

Next, as shown in FIG. 1B, using the resist pattern R1 as a mask, for example, plasma etching is performed on the interlayer insulation film 30 to form contact holes 31 to 34. The contact holes 31, 32, 33, and 34, respectively, are brought in contact with the gate electrode 13, the top surface of the silicon substrate 1, the gate electrode 23, and the dummy gate electrode 53, respectively.

In the formation of the contact holes, the top surface of the gate electrode 13 is positioned at the same height as that of the top surface of the dummy gate electrode 53 when sectionally viewed. Thus, the top surface of the dummy gate electrode 53 is exposed at a bottom of the contact hole 34 nearly simultaneously when the top surface of the gate electrode 13 is exposed at a bottom of the contact hole 31. Additionally, even after the top surfaces of the gate electrode 13 and the dummy gate electrode 53 are both exposed, plasma etching of the interlayer insulation film 30 is continued. Thereby, as shown in FIG. 1C, the top surface of the gate electrode 23 is exposed at a bottom of the contact hole 33, and then, the top surface of the silicon substrate 1 is exposed at a bottom of the contact hole 32.

Figure 8A:
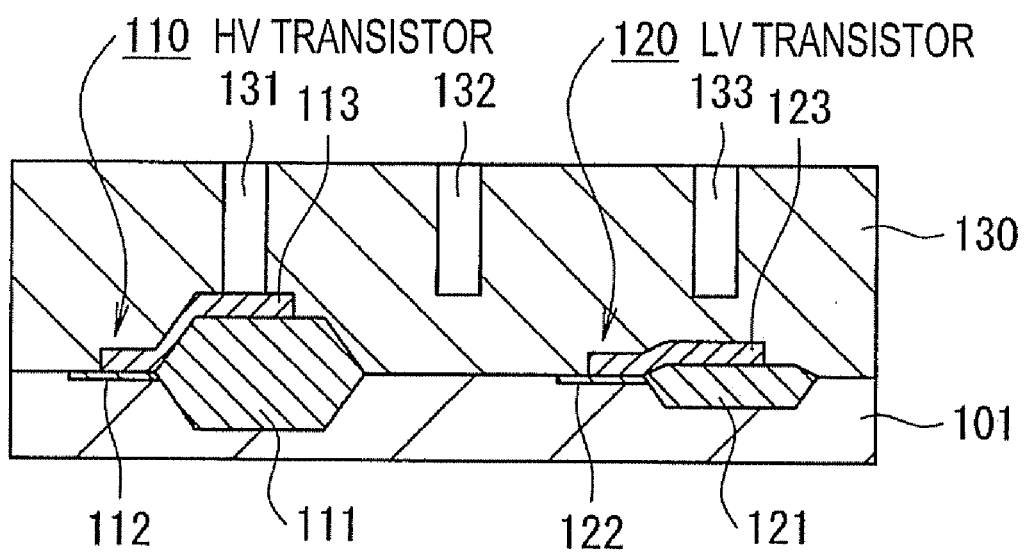
FIGS. 8A and 8B are sectional views showing a method for manufacturing a semiconductor device according to a known art.
Figure 8B:
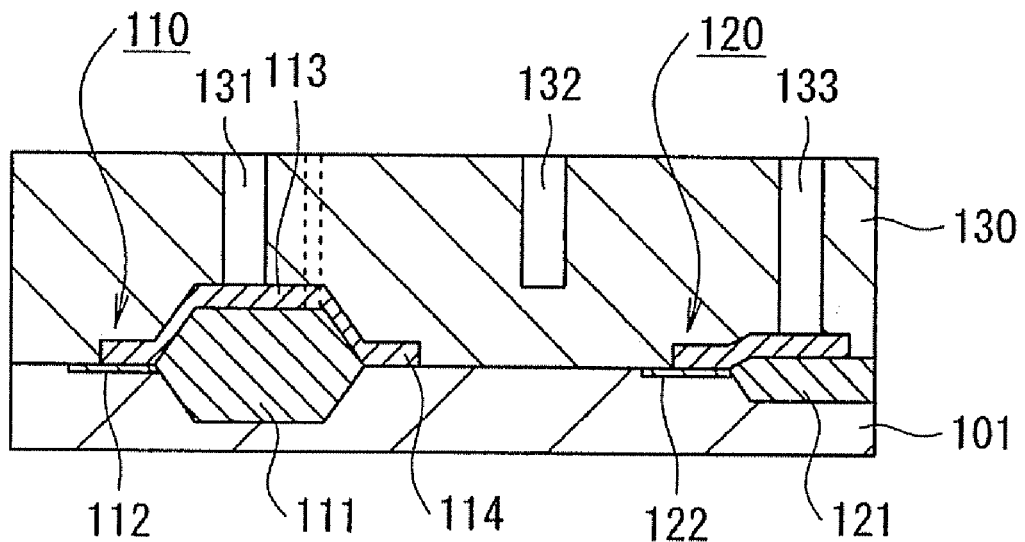

In this manner, in the formation of the contact holes shown in FIGS. 1B and 1C, during a time from the opening processing of the contact holes 31 and 34 (namely, the completion of the holes) to the completion of the contact holes 32 and 33, both the gate electrode 13 and the dummy gate electrode 53 are exposed to a plasma atmosphere. Accordingly, unlike when only the gate electrode 13 is exposed to the plasma atmosphere (namely, the known art as shown in FIG. 8), plasma charge can be dispersed to both the gate electrode 13 and the dummy gate electrode 53, thereby preventing concentration of the plasma charge on the gate electrode 13. In the present embodiment, when the dummy gate electrode 53 includes a plurality of dummy gate electrodes and as the number of the electrodes 53 to be formed is increased, the plasma charge can be dispersed more broadly, so that the plasma charge concentration can be more reduced.

After the completion of the contact holes 31 to 34, the resist pattern R1 is removed from the interlayer insulation film 30 by ashing process, for example. Then, entirely over an upper side of the silicon substrate 1 is formed a metal layer (not shown) made of aluminum or the like so as to embed the contact holes 31 to 34 in the meal layer. Patterning of the metal layer is performed by photolithography and dry etching to form a contact electrode (not shown) in each of the contact holes 31 to 34.

As described above, in the first embodiment, when the contact holes 31 to 34 are formed, the surfaces of the gate electrode 13 and of the dummy gate electrode 53 are nearly simultaneously exposed to the plasma atmosphere. Accordingly, the plasma charge can be dispersed to the gate electrode 13 and the dummy gate electrode 53, thereby preventing the plasma charge concentration on only the gate electrode 13. This can reduce damage to the gate oxide film 12, thereby preventing insulation destruction and the like. Therefore, the present embodiment can improve a yield ratio and reliability in the manufacturing of the semiconductor device.

Additionally, in the first embodiment, each of the field oxide film 51, the dummy gate oxide film 52, the dummy gate electrode 53, and the contact hole 34 is formed along with the formation of the HV transistor 10. Thus, no additional step is needed to form the dummy gate electrode 53 and the others. Furthermore, unlike the known art disclosed in JP-A-1994-310713, the formation and cutting of a fuse is not needed. Thus, neither an additional step nor an area for fuse formation is required, which can prevent a chip area increase caused by fuse formation. Consequently, as compared to the known art disclosed, manufacturing cost can be reduced. Moreover, the embodiment can prevent a fuse-specific problem such as damage to the gate oxide film 22 caused by plasma charge during fuse cutting.

Additionally, in the first embodiment, the dummy gate electrode 53 is extended from the dummy gate oxide film 52 onto the field oxide film 51. However, the embodiment does not essentially require the formation of the dummy gate oxide film 52. For example, without forming the dummy gate oxide film 52 between the dummy gate electrode 53 and the silicon substrate 1, the dummy gate electrode 53 may be directly formed on the silicon substrate 1. Also in this case, as in the foregoing description, the plasma charge can be dispersed.

In the first embodiment, the gate electrodes 13 and 23, respectively, correspond to "a first gate electrode" and "a second gate electrode", respectively, in the claimed invention. The contact holes 31, 33, and 34, respectively, correspond to "a first contact hole", "a second gate electrode", and "a dummy contact hole", respectively, in the claimed invention. Additionally, the field oxide films 11, 21, and 51, respectively, correspond to "a first element-isolation layer", "a second element-isolation layer", and "a dummy element-isolation layer, respectively, in the claimed invention. Furthermore, the silicon substrate 1 and the scribe area, respectively, correspond to "a semiconductor substrate" and "a dummy pattern formation area", respectively, in the claimed invention.

Second Embodiment

In the first embodiment described above, on the scribe area positioned between chips of the silicon substrate (namely, a wafer) 1 is provided the dummy pattern formation area where the thick field oxide film 51, the dummy gate electrode 53, and the contact hole 34 are formed. However, in the embodiment, the arrangement position of the dummy pattern formation area is not limited to the position on the scribe area.

Figure 2:
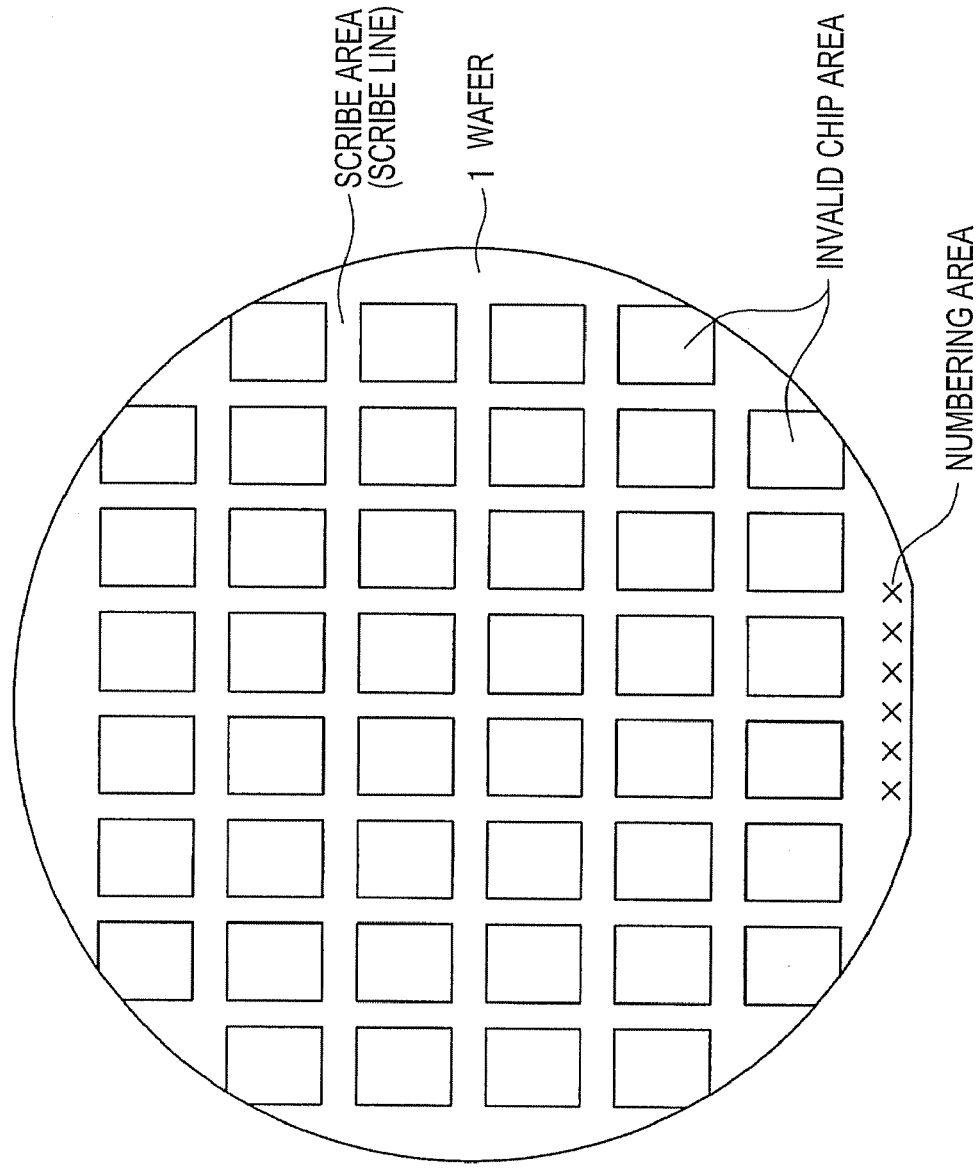
FIG. 2 is a diagram showing a scribe area, an invalid chip area, and a numbering area provided on a wafer.

For example, as shown in FIG. 2, the dummy pattern formation area may be disposed in an invalid chip area that is positioned on an outer peripheral area of the wafer 1 and where no chip is formed as a product, or on a numbering area or the like that is positioned near an orientation flat and where a lot number or the like is directly printed. On the dummy pattern formation area may be formed the thick field oxide film 51, the dummy gate electrode 53, and the contact hole 34 shown in FIG. 1. Also in this structure, the same advantages as those in the first embodiment can be obtained. Furthermore, when the dummy pattern formation area is provided not on the scribe area but on the invalid chip area, the numbering area or the like on the wafer 1, it is unnecessary to dice the dummy gate electrode 53 and the contact electrode made of the metal layer or the like formed on the dummy gate electrode 53. This can suppress the occurrence of chipping (in which the metal layer is chipped during dicing and turned into burrs or debris). Consequently, this can reduce the possibility of the occurrence of defects such as a short circuit between wires due to the burrs or the debris generated by the chipping.

Additionally, the arrangement position of the dummy pattern formation area is not limited to the position on the non-chip formation areas such as the scribe area, the invalid chip area, and the numbering area described above. For example, the dummy pattern formation area may be arranged on an element isolation area, a guard ring formation area or the like on a chip. Hereinafter, a description will be given of a case in which the dummy pattern formation area is arranged on the guard ring formation area.

Figure 3A:
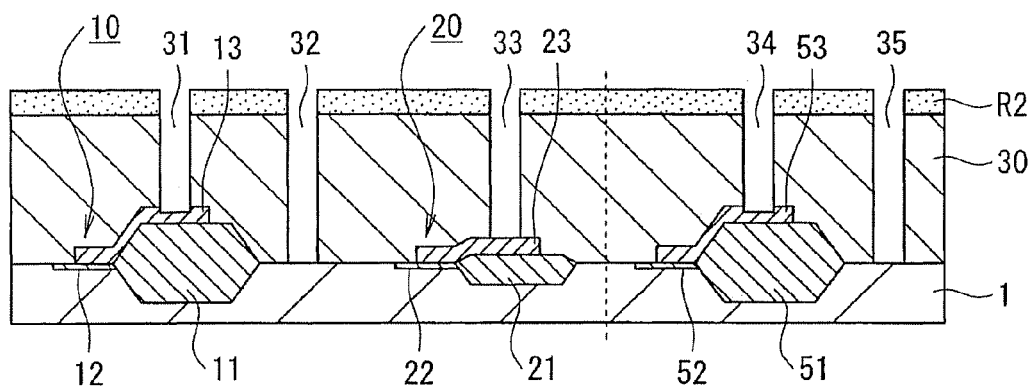
FIGS. 3A and 3B are sectional views showing a method for manufacturing a semiconductor device according to a second embodiment of the invention.
Figure 3B:
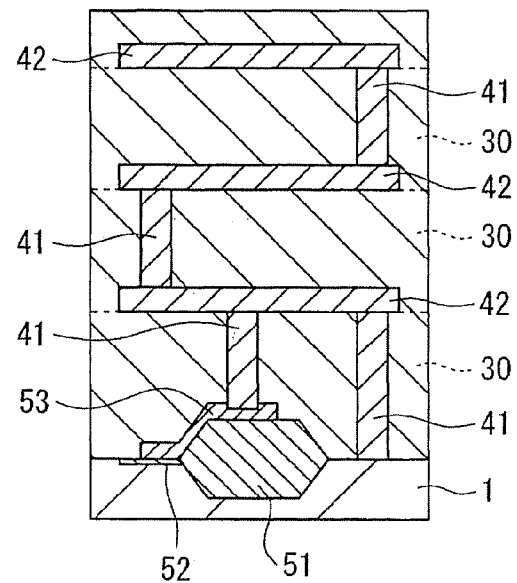

FIGS. 3A and 3B are sectional views showing a method for manufacturing a semiconductor device according to a second embodiment of the invention. In the drawings, the same reference numerals are given to the same components as those in FIGS. 1A to 1C, and descriptions thereof will be omitted. In FIG. 3A, for example, using the LOCOS method, the field oxide film 11 is formed on the transistor formation area of the silicon substrate 1, and simultaneously, the field oxide film 51 is formed on the guard ring formation area of the chip. Additionally, following the formation of the field oxide films 11 and 51, the field oxide film 21 is formed on the transistor formation area of the silicon substrate 1 by using the LOCOS method or the like.

Next, the gate oxide films 12 and 22 are formed on the transistor formation area on the surface of the silicon substrate 1, and simultaneously, the dummy gate oxide film 52 is formed on the guard ring formation area on the surface of the silicon substrate 1. Then, for example, using the CVD method, the polysilicon film is formed on the entire surface of the silicon substrate 1 so as to cover the gate oxide films 12, 22 and the dummy gate oxide film 52. Thereafter, patterning of the polysilicon film is performed to simultaneously form the gate electrodes 13, 23, and the dummy gate electrode 53. As shown in FIG. 3A, in this case, the dummy gate electrode 53 is extended onto the field oxide film 51 formed on the guard ring formation area.

Next, on the silicon substrate 1 is formed the interlayer insulation film 30, and the surface of the insulation film is planarized by the CMP method, for example. Then, on the interlayer insulation film 30 is formed a resist pattern R2. Using the resist pattern R2 as a mask, for example, plasma etching is performed on the interlayer insulation film 30. Thereby, the contact holes 31 to 33 are formed on the transistor formation area, as well as the contact holes 34 and 35 are formed on the guard ring formation area. In this case, the contact hole 34 forms a contact with the dummy gate electrode 53. Additionally, the contact hole 35, which is formed on a more outer peripheral side of the chip than the contact hole 34, forms a contact with the guard ring formation area on the surface of the silicon substrate 1.

As shown in FIG. 3A, also in the second embodiment, the top surface of the gate electrode 13 is positioned at the same height as that of the top surface of the dummy gate electrode 53 when sectionally viewed. Accordingly, the top surface of the dummy gate electrode 53 is exposed at the bottom of the contact hole 34 nearly simultaneously when the top surface of the gate electrode 13 is exposed at the bottom of the contact hole 31. This can prevent the concentration of plasma charge on the gate electrode 13.

Next, each contact electrode is formed in each of the contact holes 31 to 35. Thereafter, the metal layer made of aluminum or the like is formed on the interlayer insulation film 30, and then, patterning of the metal layer is performed to form a wiring layer. As shown in FIG. 3B, on the guard ring formation area, the formation of the interlayer insulation film 30, the formation of the contact holes (or via holes), the formation of contact electrodes 41, and the formation of wiring layers 42 are sequentially repeated, thereby forming a guard ring configured by an alternate laminate of the contact electrodes 41 and the wiring layers 42 directed upward.

As described above, in the second embodiment, as in the first embodiment, the plasma charge can be dispersed to the gate electrode 13 and the dummy gate electrode 53, thereby preventing the concentration of the plasma charge on the gate electrode 13. This can reduce damage to the gate oxide film 12, so as to prevent insulation destruction or the like.

Additionally, in the second embodiment, the guard ring formation area doubles as the dummy pattern formation area, so that any area exclusive for the dummy pattern formation area is not needed on the chip. Thus, as in the first embodiment, the chip area increase can be prevented.

In the second embodiment, the guard ring formation area and the element isolation area on the chip, as well as the invalid chip area and the numbering area outside the chip, respectively, correspond to "a dummy pattern formation area" in the claimed invention. Other corresponding relationships are the same as those in the first embodiment.

Third Embodiment

Figure 4A:
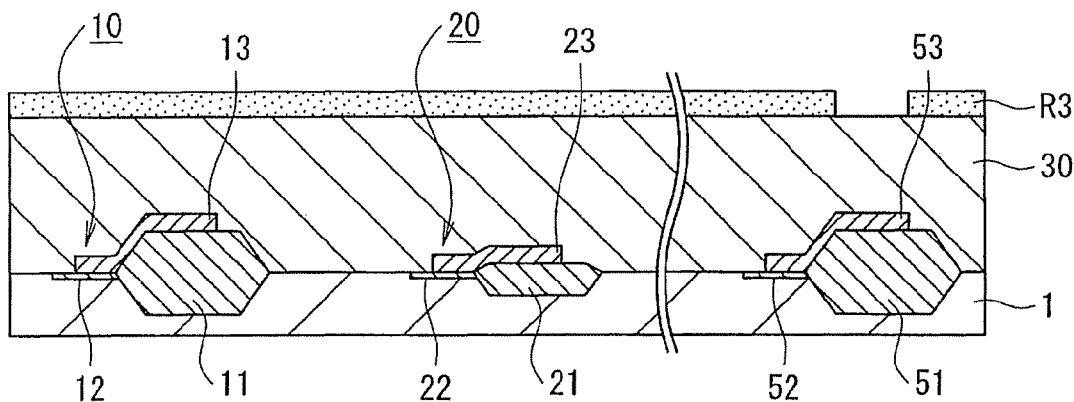
FIGS. 4A to 4C are sectional views showing a method for manufacturing a semiconductor device according to a third embodiment of the invention.
Figure 4B:
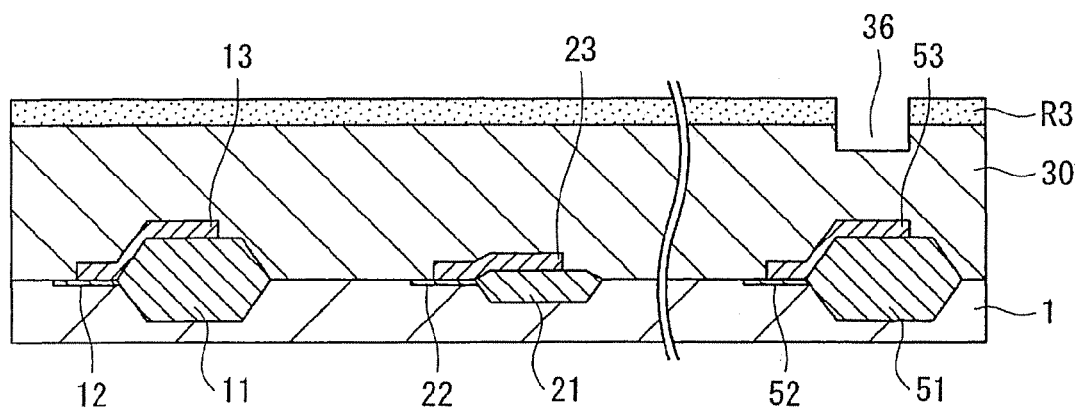
Figure 4C:
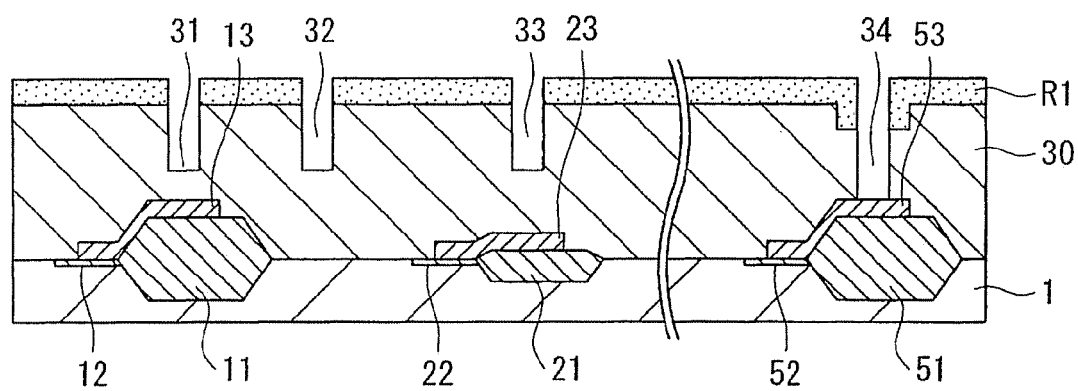

FIGS. 4A to 4C are sectional views showing a method for manufacturing a semiconductor device according to a third embodiment of the invention. In the drawings, the same reference numerals are given to the same components as those shown in FIGS. 1A to 1C and detailed descriptions thereof will be omitted.

In FIG. 4A, first, on the silicon substrate 1 are formed the field oxide films 11, 21, and 51. Next, the gate oxide films 12, 22 and the dummy gate oxide film 52 are simultaneously formed, which is followed by the simultaneous formation of the gate electrodes 13, 23 and the dummy gate electrode 53. Next, on the silicon substrate 1 is formed the interlayer insulation film 30 so as to cover those formed, and the surface of the interlayer insulation film 30 is planarized by the CMP method, for example. Then, an opening is formed at a portion immediately above the dummy gate electrode 53 extended onto the field oxide film 51, whereas a resist pattern R3 is formed on the interlayer insulation film 30 to cover remaining portions. Thereafter, using the resist pattern R3 as a mask, etching of the interlayer insulation film 30 is performed. As a result, as shown in FIG. 4B, a recessed portion 36 is formed at a portion of the interlayer insulation film 30 immediately above the dummy gate electrode 53. In this case, the recessed portion 36 is formed immediately above the dummy gate electrode 53, whereas no recessed portion is formed immediately above the gate electrode 13.

Next, for example, using ashing process, the resist pattern R3 is removed from the surface of the interlayer insulation film 30. Then, as shown in FIG. 4C, the resist pattern R1 is formed on the interlayer insulation film 30. Using the resist pattern R1 as a mask, for example, plasma etching of the interlayer insulation film 30 is performed to form the contact holes 31 to 34.

In this situation, the recessed portion 36 is already formed immediately above the dummy gate electrode 53, so that the thickness of the interlayer insulation film 30 immediately above the dummy gate electrode 53 is smaller than that of the interlayer insulation film 30 immediately above the gate electrode 13. Accordingly, before the top surface of the gate electrode 13 is exposed at the bottom of the contact hole 31, the top surface of the dummy gate electrode 53 can be exposed at the bottom of the contact hole 34. In this manner, as compared to the first and the second embodiments, the plasma charge concentration on the gate electrode 13 can be more surely prevented.

In the third embodiment, the recessed portion 36 corresponds to "a recessed portion" in the claimed invention. Other corresponding relationships are the same as those in the first embodiment.

Fourth Embodiment

Figure 5A:
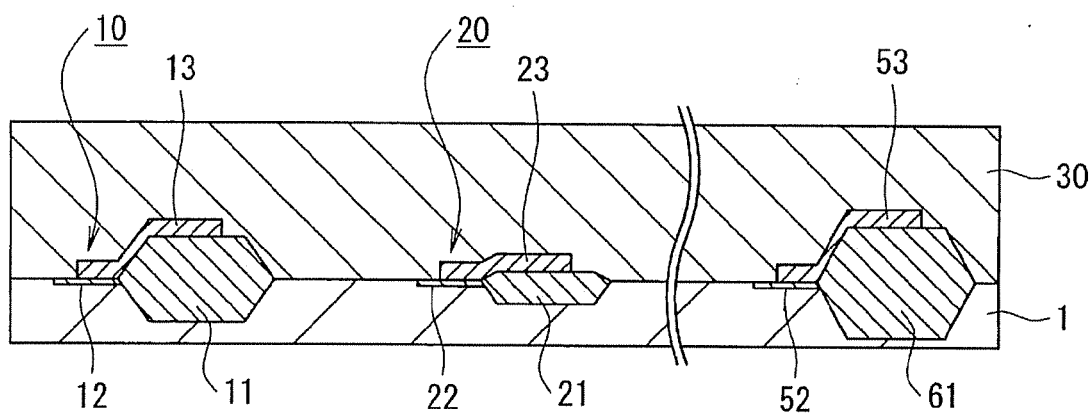
FIGS. 5A and 5B are sectional views showing a method for manufacturing a semiconductor device according to a fourth embodiment of the invention.
Figure 5B:
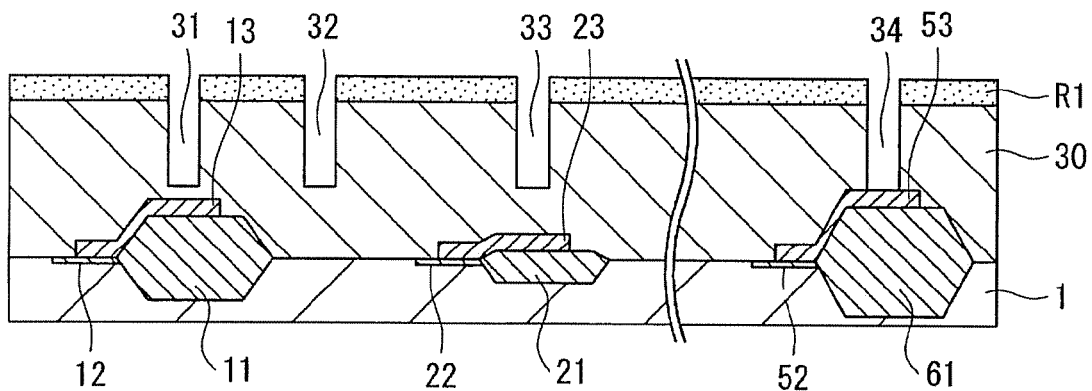

FIGS. 5A and 5B are sectional views showing a method for manufacturing a semiconductor device according to a fourth embodiment of the invention. In the drawings, the same reference numerals are given to the same components as those in FIGS. 1A to 1C and detailed descriptions thereof will be omitted. In the fourth embodiment, on the scribe area of the silicon substrate 1 is formed a field oxide film 61 having a thickness larger than that of the field oxide film 11. Then, the dummy gate electrode 53 is extended onto the field oxide film 61, so as to obtain the same advantage as that in the third embodiment.

More specifically, in FIG. 5A, on the transistor formation area of the silicon substrate 1 is formed each of the field oxide films 11 and 21. Additionally, on the scribe area of the silicon substrate 1 is formed the field oxide film 61 thicker than the field oxide film 11. The field oxide films 11, 21, and 61 are formed by the LOCOS method, for example. Any of the field oxide films may be first formed. For example, when forming the field oxide film 61 having a largest thickness, the area for forming the field oxide films 11 and 21 may be covered by a silicon nitride film. Next, in order to form the field oxide film 11 having a second largest thickness, an area portion for forming at least the field oxide film 21 may be covered by the silicon nitride film. In this manner, the field oxide films 11, 21, and 61 can be formed with mutually different thicknesses.

Next, the gate oxide films 12, 22, and 52 are simultaneously formed, and subsequently, the gate electrodes 13, 23, and the dummy gate electrode 53 are simultaneously formed. In this case, the dummy gate electrode 53 is extended onto the field oxide film 61 formed on the scribe area. Then, the interlayer insulation film 30 is formed on the silicon substrate 1 so as to cover the formed electrodes, and the surface of the interlayer insulation film 30 is planarized by the CMP method or the like. Next, as shown in FIG. 5B, the resist pattern R1 is formed on the interlayer insulation film 30. Using the resist pattern R1 as a mask, plasma etching of the interlayer insulation film 30 is performed to form the contact holes 31 to 34.

The field oxide film 61 is positioned under the dummy gate electrode 53 and has a height from the top surface of the silicon substrate 1 larger than the height of the field oxide film 11 from the substrate top surface. Accordingly, the thickness of the interlayer insulation film 30 positioned immediately above the dummy gate electrode 53 is smaller than the thickness of the interlayer insulation film 30 positioned immediately above the gate electrode 13.

Therefore, before the top surface of the gate electrode 13 is exposed at the bottom of the contact hole 31, the top surface of the dummy gate electrode 53 can be exposed at the bottom of the contact hole 34. Thus, as in the third embodiment, the concentration of plasma charge on the gate electrode 13 can be more surely prevented.

In the fourth embodiment, the field oxide film 61 corresponds to "a dummy element-isolation layer" in the claimed invention. Other corresponding relationships are the same as those in the first embodiment.

Fifth Embodiment

Figure 6A:
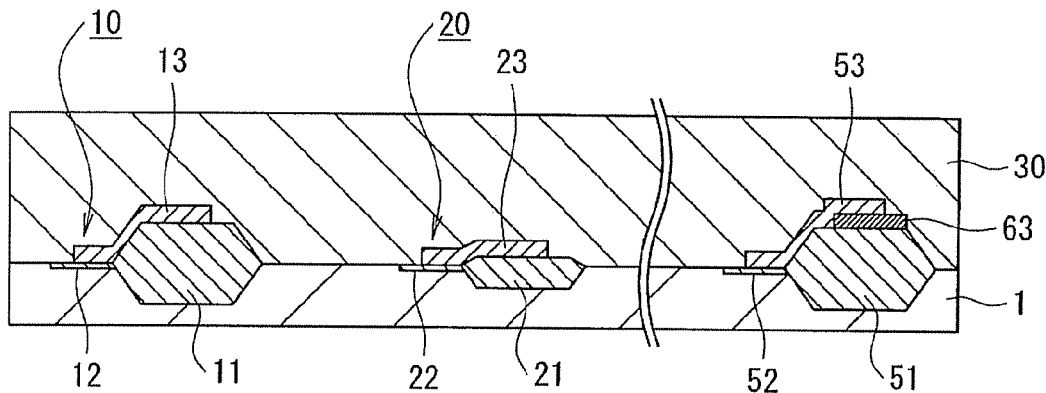
FIGS. 6A and 6B are sectional views showing a method for manufacturing a semiconductor device according to a fifth embodiment of the invention.
Figure 6B:
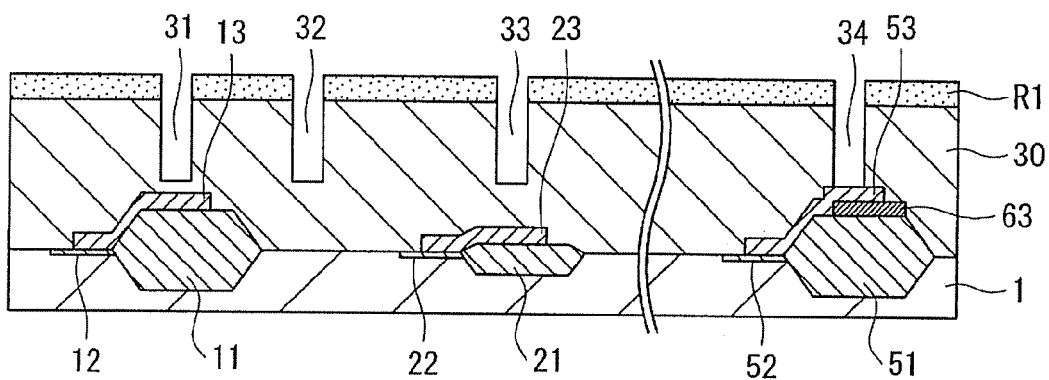

FIGS. 6A and 6B are sectional views showing a method for manufacturing a semiconductor device according to a fifth embodiment of the invention. In the drawings, the same reference numerals are given to the same components as those shown in FIGS. 1A to 1C, and detailed descriptions thereof will be omitted. In the fifth embodiment, a height-adjusting insulation film is disposed between the field oxide film 51 and the dummy gate electrode 53 so as to obtain the same advantage as that in the third and the fourth embodiments.

Specifically, in FIG. 6A, the field oxide film 11 is formed on the transistor formation area of the silicon substrate 1, and simultaneously, the field oxide film 51 is formed on the scribe area. Additionally, following the formation of the field oxide films 11 and 51, the field oxide film 21 is formed on the transistor formation area of the silicon substrate 1.

Next, for example, using the CVD method, a silicon nitride film 63 is formed on the entire surface of the silicon substrate 1. Then, patterning of the silicon nitride film 63 is performed using photolithography and dry etching. Thereby, the silicon nitride film 63 is left only on the field oxide film 51 of the scribe area and removed from remaining portions.

Next, the gate oxide films 12, 22 and the dummy gate oxide film 52 are simultaneously formed, and subsequently, the gate electrodes 13, 23 and the dummy gate electrode 53 are simultaneously formed. As shown in FIG. 6A, in the fifth embodiment, the dummy gate electrode 53 is formed so as to be extended onto the silicon nitride film 63 formed on the scribe area.

Next, the interlayer insulation film 30 is formed on the silicon substrate 1, and the surface of the insulation film 30 is planarized by the CMP method or the like. Then, as shown in FIG. 6B, the resist pattern R1 is formed on the interlayer insulation film 30. Using the resist pattern R1 as a mask, for example, plasma etching of the film 30 is performed to form the contact holes 31 to 34. In this case, forming the silicon nitride film 63 under the dummy gate electrode 53 allows the top surface of the dummy gate electrode 53 to be higher than that of the gate electrode 13 when sectionally viewed. Thereby, the thickness of the interlayer insulation film 30 immediately above the dummy gate electrode 53 is smaller than that of the film 30 immediately above the gate electrode 13.

Accordingly, before the top surface of the gate electrode 13 is exposed at the bottom of the contact hole 31, the top surface of the dummy gate electrode 53 can be exposed at the bottom of the contact hole 34. In this manner, plasma charge concentration on the gate electrode 13 can be more surely prevented, as in the third and the fourth embodiments.

In the fifth embodiment, the silicon nitride film 63 corresponds to "an insulation film" in the claimed invention. Other corresponding relationships are the same as those in the first embodiment.

Sixth Embodiment

Figure 7:
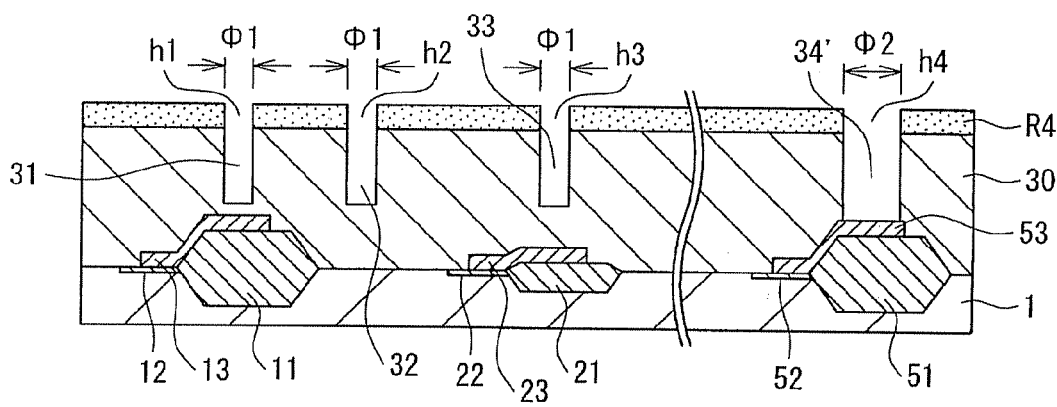
FIG. 7 is a sectional view showing a method for manufacturing a semiconductor device according to a sixth embodiment of the invention.

FIG. 7 is a sectional view showing a method for manufacturing a semiconductor device according to a sixth embodiment of the invention. In the drawings, the same reference numerals are given to the same components as those in FIGS. 1A to 1C, and detailed descriptions thereof will be omitted. The sixth embodiment focuses on a point that in the formation of the contact holes, as diameters of the contact holes become larger, the rate of etching becomes faster (namely, opening processing is completed faster). The embodiment takes advantage of the point to obtain the same advantage as in the third to the fifth embodiments.

Specifically, in FIG. 7, the field oxide film 11 is formed on the transistor formation area of the silicon substrate 1, and simultaneously, the field oxide film 51 is formed on the scribe area of the silicon substrate 1. Additionally, following the formation of the field oxide films 11 and 51, the field oxide film 21 is formed on the transistor formation area of the substrate 1. Next, the gate oxide films 12, 22 and the dummy gate electrode 52 are simultaneously formed, and subsequently, the gate electrodes 13, 23 and the dummy gate electrode 53 are also simultaneously formed. Then, the interlayer insulation film 30 is formed on the silicon substrate 1, and the surface of the film 30 is planarized by the CMP method or the like.

Next, on the interlayer insulation film 30 is formed a resist pattern R4, which has each opening at a portion immediately above the gate electrode 13 extended onto the field oxide film 11, at a portion immediately above the transistor formation area of the silicon substrate 1, at a portion immediately above the gate electrode 23 extended onto the field oxide film 21, and at a portion immediately above the dummy gate electrode 53 extended onto the field oxide film 51. In this case, the resist pattern R4 has opening holes h1 to h4 having a round shape in a planar view (namely, a round planar shape), for example. For example, when the opening hole h1 immediately above the gate electrode 13, the opening hole h2 immediately above the transistor formation area, and the opening hole h3 immediately above the gate electrode 23 have a diameter represented by $\phi 1$, as well as the opening hole h4 immediately above the dummy gate electrode 53 has a diameter represented by $\phi 2$, the diameter $\phi 1$ is smaller than the diameter $\phi 2$.

Next, using the resist pattern R4 as a mask, for example, plasma etching of the interlayer insulation film 30 is performed to form the contact holes 31 to 34'. In this case, as the diameters of the openings of the resist pattern R4 become larger, the etching of the interlayer insulation film 30 under the resist pattern R4 becomes easier, whereby opening processing can be more facilitated. In other words, etching rate of the interlayer insulation film 30 under the resist pattern R4 is faster in the opening hole h4 than in the opening hole h1.

Accordingly, before the top surface of the gate electrode 13 is exposed at the bottom of the contact hole 31, the top surface of the dummy gate electrode 53 can be exposed at a bottom of the contact hole 34'. Thus, as in the third to the fifth embodiments, plasma charge concentration on the gate electrode 13 can be more surely prevented.

In the sixth embodiment, the contact hole 34' corresponds to "a dummy contact hole" in the claimed invention. Other corresponding relationships are the same as those in the first embodiment.

What is claimed is:

1. A method for manufacturing a semiconductor device having a high breakdown voltage transistor and a low breakdown voltage transistor provided on a same semiconductor substrate, the method comprising:

forming a first gate electrode of the high breakdown voltage transistor and a second gate electrode of the low breakdown voltage transistor on a transistor formation area of the substrate, as well as a dummy gate electrode on a dummy pattern formation area of the substrate;

forming an interlayer insulation film on the substrate so as to cover the first and the second gate electrodes and the dummy gate electrode; and forming a first contact hole on the first gate electrode, a second contact hole on the second gate electrode, and a dummy contact hole on the dummy gate electrode, respectively, by partially dry etching the interlayer insulation film, wherein in the formation of the contact holes, a top surface of the dummy gate electrode is exposed at a bottom of the dummy contact hole before a top surface of the first gate electrode is exposed at a bottom of the first contact hole;

forming a first element-isolation film on the transistor formation area of the semiconductor substrate;

forming a second element-isolation film on the transistor formation area of the substrate in such a manner that a height from a to surface of the substrate to a top surface of the second element-isolation film is lower than a height from the substrate top surface to a top surface of the first element-isolation film; and forming a dummy element-isolation film on the dummy pattern formation area of the substrate in such a manner that a height from the substrate top surface to a top surface of the dummy element-isolation film is equal to or higher than the height from the substrate top surface to the top surface of the first element-isolation film, wherein in the formation of the gate electrodes, the first gate electrode, the second gate electrode, and the dummy gate electrode, respectively, are extended onto the first element-isolation film, the second element-isolation film, and the dummy element-isolation film, respectively, and wherein in the formation of the contact holes, portions of the interlayer insulation film positioned immediately above the first element-isolation film and immediately above the dummy element-isolation film are etched in a same processing step to form the first contact hole and the dummy contact hole, respectively.

2. The method for manufacturing a semiconductor device according to claim 1, further comprising forming a recessed portion immediately above the dummy electrode extended onto the dummy element-isolation film by partially dry etching the interlayer insulation film before forming the first and the second contact holes and the dummy contact hole, without forming any recessed portion immediately above the first gate electrode extended onto the first element-isolation film.

3. The method for manufacturing a semiconductor device according to claim 1, further comprising forming an insulation film on the dummy element-isolation film, without forming any insulation film on the first element-isolation film, wherein in the formation of the gate electrodes, the dummy gate electrode is extended onto the insulation film formed on the dummy element-isolation film.

4. The method for manufacturing a semiconductor device according to claim 1, wherein when diameters of the first contact hole and the dummy contact hole are represented by $\phi 1$ and $\phi 2$, respectively, the first and the dummy contact holes are formed in such a manner that the diameter $\phi 1$ is smaller than the diameter $\phi 2$.

5. The method for manufacturing a semiconductor device according to claim 1, wherein the dummy pattern formation area is provided on a guard ring formation area positioned at a periphery of a chip formation area.

6. The method for manufacturing a semiconductor device according to claim 1, wherein the dummy pattern formation area is provided on a non-chip formation area.

* * * * *